United States Patent
Asakawa

(10) Patent No.: US 6,903,397 B2
(45) Date of Patent: Jun. 7, 2005

(54) METHOD FOR MANUFACTURING NON-VOLATILE MEMORY DEVICE AND NON-VOLATILE MEMORY DEVICE AND SEMICONDUCTOR DEVICE

(75) Inventor: Tsutomu Asakawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/738,730

(22) Filed: Dec. 16, 2003

(65) Prior Publication Data

US 2004/0129962 A1 Jul. 8, 2004

Related U.S. Application Data

(62) Division of application No. 09/695,565, filed on Oct. 24, 2000, now Pat. No. 6,686,211.

(30) Foreign Application Priority Data

Oct. 25, 1999 (JP) .......................................... 11-302820

(51) Int. Cl.[7] .............................................. H01L 29/76
(52) U.S. Cl. ...................... 257/295; 257/298; 257/303; 257/306; 257/324; 438/3; 438/240
(58) Field of Search .................... 257/68, 71, 295–314, 257/324–326, 303, 306, 686; 438/3, 240, 99, 396, 399

(56) References Cited

U.S. PATENT DOCUMENTS

| | | | | |
|---|---|---|---|---|
| 4,860,254 A | * | 8/1989 | Pott et al. .................... | 365/145 |
| 5,416,042 A | | 5/1995 | Beach et al. .................. | 437/60 |
| 6,087,196 A | * | 7/2000 | Sturm et al. .................. | 438/29 |
| 6,198,151 B1 | * | 3/2001 | Wada .......................... | 257/520 |
| 6,335,206 B1 | | 1/2002 | Nishimura .................... | 438/3 |
| 6,670,659 B1 | * | 12/2003 | Gudesen et al. ............. | 257/295 |

FOREIGN PATENT DOCUMENTS

| | | |
|---|---|---|
| JP | 02-140973 | 5/1990 |
| JP | 07-335840 | 12/1995 |
| JP | 09-134891 | 5/1997 |

(Continued)

OTHER PUBLICATIONS

Melnick et al., "Recent Results on Switching, Fatigue and Electrical Characterization of Sol–Gel Based PZT Capacitors," *Ferroelectrics*, 1991, vol. 116, pp. 79–93.

(Continued)

*Primary Examiner*—David Nelms
*Assistant Examiner*—Andy Huynh
(74) *Attorney, Agent, or Firm*—Konrad, Raynes & Victor, LLP; Alan S. Raynes

(57) ABSTRACT

A semiconductor device embodiment may include a plurality of cells each including a transistor therein, the cells also each including a first capacitor electrode therein, the first capacitor electrodes being positioned on an insulating layer, the first capacitor electrodes in adjacent cells being separated from each other. The device may also include partitioning members on the insulation layer, wherein the partitioning members are positioned to separate the cells from one another, and the partitioning members include an upper surface thereon. The device also may include an organic layer on the first capacitor electrodes between the partitioning members, wherein the organic layer is not positioned in contact with the upper surface of the partitioning members. The device may also include a continuous second capacitor electrode on the organic layer, the second capacitor electrode layer formed to be a common electrode for cells. In another aspect, the organic layer may be capable of a polarization inversion by exposure to an electric field. In another aspect, the partitioning members may include first and second layers, the first layer being formed from a material having an affinity for an organic solution used to form the organic layer, the second layer being formed from a material having a non-affinity for the organic solution used to form the organic layer.

23 Claims, 8 Drawing Sheets

FOREIGN PATENT DOCUMENTS

| | | |
|---|---|---|
| JP | 10-022470 | 1/1998 |
| JP | 10-064415 | 3/1998 |
| JP | 10-326869 | 12/1998 |
| JP | 11-204529 | 7/1999 |
| JP | 11-214626 | 8/1999 |
| WO | 99/ 12170 | 3/1999 |
| WO | 99/ 38203 | 7/1999 |

OTHER PUBLICATIONS

Japanese Office Action for JP11–302820, dated Aug. 3, 2004, which lists JP02–140973, JP10–022470, JP10–326869, WO99/12170, JP10–064415, JP09–134891, and JP11–204529.

* cited by examiner

METHOD FOR MANUFACTURING NON-VOLATILE MEMORY DEVICE AND NON-VOLATILE MEMORY DEVICE AND SEMICONDUCTOR DEVICE This application is a Divisional of U.S. application Ser. No. 09/695,565, filed Oct. 24, 2000, now U.S. Pat. No. 6,686,211, which is hereby incorporated by reference in its entirety.

TECHNICAL FIELD

The present invention relates to devices and techniques for manufacturing devices such as non-volatile memory devices.

RELATED ART

FIG. 8 shows a cross-sectional structure of a 1T1C (1 transistor+1 capacitor) type non-volatile ferroelectric memory device with a stacked type cell structure. Referring to the figure, a semiconductor substrate 1 is formed with a cell transistor 17 that is mainly composed of a gate electrode 2, a source region 3 and a drain region 4, and a device element isolation insulation film 5. The cell transistor 17 that forms each memory cell is connected to a ferroelectric capacitor 18 through an interlayer insulation film 6. The ferroelectric capacitor 18 is composed of a lower electrode 7, a ferroelectric film 19 and an upper electrode 9, wherein the ferroelectric film 19 is formed from a PZT ferroelectric material, a SBT ferroelectric material or the like. The lower electrode 7 connects to the drain region 4 through a contact hole that is opened in the interlayer insulation film 6, and the upper electrode 9 connects to a plate line 20 through a contact hole that is opened in an interlayer insulation film 21. Also, the gate electrode 2 connects to a word line, and the source region 3 connects to a bit line.

When the non-volatile ferroelectric memory device having the structure describe above is manufactured, for example, as described in Japanese laid-open patent application HEI 7-335840 and Japanese laid-open patent application HEI 11-214626, the cell transistor 17 is formed on the semiconductor substrate 1 using a semiconductor process, and then the ferroelectric capacitor 18 to be connected to the cell transistor 17 is formed using a ferroelectric process such as the Sol-Gel method. A film forming method for the ferroelectric film 19 using the Sol-Gel method is described in detail in *Ferroelectrics*, Vol. 116, pp. 79–93, "Recent Result on Switching, Fatigue and Electrical Characterization of Sol-Gel based PZT Capacitors".

It is noted that, in the present specification, a ferroelectric process refers to a process for forming a capacitor insulation film composed of, for example, a PZT or SBT ferroelectric material and the like that is used for a ferroelectric capacitor, as well as a film such as an organic thin film that can undergo a polarization inversion by an external electric field.

However, when the non-volatile ferroelectric memory device having a multiple-layered structure is manufactured by the above-described method, the cell transistor 17 is formed in a lower layer, and then the ferroelectric capacitor 18 is formed above in an upper layer. Accordingly, a problem has been pointed out that the ferroelectric film 19 that is formed from an oxide develops an oxygen deficiency by a reducing atmosphere, and therefore deterioration of its characteristics occurs.

The characteristic deterioration due to the oxygen deficiency of the ferroelectric capacitor 18 can be restored by a heat treatment conducted under an oxygen atmosphere at temperatures of 550° C.~600° C. However, a heat treatment cannot be conducted after a process of wiring a low melting-point metal such as aluminum. Furthermore, although PZT based materials are often used for ferroelectric films, non-volatile memory devices may preferably be manufactured with a material that does not contain zinc, in consideration of the pollution of the process line by diffusion of zinc in the manufacturing process.

Accordingly, it is an object of certain embodiments of the present invention to provide devices and methods for manufacturing a non-volatile memory device with a ferroelectric process that conforms with a semiconductor process for forming cell transistors.

SUMMARY

To solve the problems described above, in accordance with certain embodiments of the present invention, when a non-volatile memory device having a ferroelectric capacitor that is formed from an organic thin film capable of a polarization inversion by an external electric field provided between a lower electrode and an upper electrode is manufactured, a material solution for the organic thin film is coated on the lower electrode, and is solidified to thereby form an organic thin film. According to such embodiments, the film forming temperature of the organic thin film is lower than 150° C.~200° C., which does not cause damage to cell transistors, and therefore a ferroelectric process that conforms with a semiconductor process is provided.

The material solution for the organic thin film may preferably include, for example, a material solution containing a copolymer of vinylidene fluoride and trifluoroethylene dissolved in a solvent. An ink jet type recording head may be used to coat the material solution for the organic thin film on the lower electrode, with the result that a highly accurate patterning can be performed.

Also, in accordance with certain embodiments of the present invention, a material solution that contains fine particles of the upper electrode may be coated on the organic thin film and solidified to thereby form an upper electrode. In this case, an ink jet type recording head may be used to coat the material solution for the upper electrode, with the result that patterning and film formation of the upper electrode can be simultaneously conducted with a high level of precision.

Also, in accordance with certain embodiments of the present invention, partitioning members to partition lower electrodes provided in respective memory cells may be formed, and the material solution for the organic thin film may be filled over the lower electrodes that are partitioned by the partitioning members and solidified to thereby form the organic thin film. In accordance with such embodiments, cross talk between the memory cells accompanied with a higher integration of memory devices can be prevented.

In certain embodiments described above, an upper layer of the partitioning member may preferably be formed with a material that does not have an affinity for the material solution for the organic thin film. By such a structure, the material solution for the organic thin film can be readily coated. The material with non-affinity may preferably include, for example, polyimide, amorphous silicon, polysilicon or an organic compound including fluorine.

A preferred device embodiment includes a non-volatile memory device comprising a ferroelectric capacitor that is formed from an organic thin film capable of a polarization inversion by an external electric field and provided between a first electrode and a second electrode. The device also includes partitioning members formed to mutually partition the organic thin film, wherein the partitioning members are formed to include a first insulation layer and a second insulating layer that repels an organic thin film solution used to form the organic thin film.

Another preferred device embodiment includes a semiconductor device including a ferroelectric capacitor that is provided between a lower electrode and an upper electrode, the semiconductor device comprising a semiconductor substrate including a transistor and an insulation layer on the transistor. A lower electrode is positioned on the insulation layer, wherein the lower electrode is in electrical contact with a part of the transistor. Partitioning members are positioned on the insulation layer, the partitioning members adapted to separate the lower electrode from other lower electrodes, the partitioning members including an upper surface. The device also includes a solid organic layer on the lower electrode that is partitioned from other lower electrodes by the partitioning members, wherein the solid organic layer is not positioned on the upper surface of the partitioning members.

Another preferred device embodiment includes a semiconductor device, comprising a plurality of cells each including a transistor therein, the cells also each including a first capacitor electrode therein, the first capacitor electrodes being positioned on an insulating layer, the first capacitor electrodes in adjacent cells being separated from each other. The device also includes partitioning members on the insulation layer, wherein the partitioning members are positioned to separate the cells from one another, the partitioning members including an upper surface. The device also includes an organic layer on the first capacitor electrodes between the partitioning members, wherein the organic layer is not positioned in contact with the upper surface of the partitioning members. The device also includes a continuous second capacitor electrode on the organic layer, the second capacitor electrode layer formed to be a common electrode for the cells.

Figure 1:
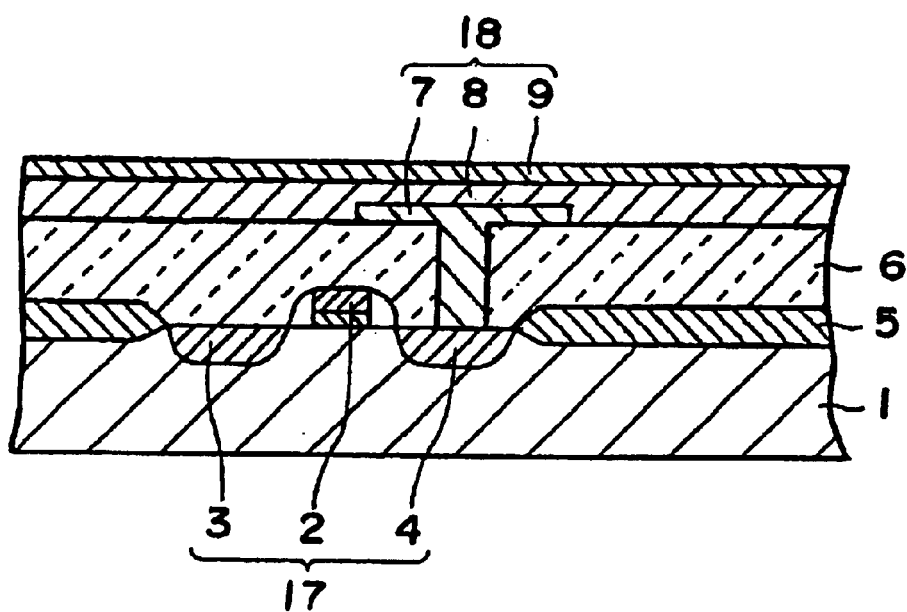
FIG. 1 shows a cross-sectional view of a non-volatile memory device in accordance with a first embodiment of the present invention.

1 . . . Semiconductor substrate
17 . . . Cell transistor
7 . . . Lower electrode
8 . . . Organic thin film
9 . . . Upper electrode
10 . . . Memory cell array
15 . . . Ink jet type recording head
18 . . . Ferroelectric capacitor

DETAILED DESCRIPTION

Hereunder, a first embodiment of the present invention is described with reference to FIGS. 1 through 3.

FIG. 1 shows a cell cross-sectional structure of a non-volatile memory device in accordance with the present embodiment. The non-volatile memory device shown in the figure has a stacked type cell structure, in which a cell transistor 17 formed from a gate electrode 2, a source region 3 and a drain region 4 and an element isolation insulation film 5 are formed over a semiconductor substrate 1, and a ferroelectric capacitor 18 is formed above in an upper layer through an interlayer insulation film 6. The ferroelectric capacitor 18 is composed of a lower electrode 7, an organic thin film 8 and an upper electrode 9. The organic thin film 8 is formed from an organic material having a spontaneous polarization, and can undergo a polarization inversion in response to a voltage applied to the organic thin film 8 by the upper electrode 9 and the lower electrode 7. By utilizing the polarization characteristic, data reading/writing can be conducted.

A copolymer of vinylidene fluoride and trifluoroethylene, described in PCT publication WO99/12170, for example, can be used as an organic material that forms the organic thin film 8. The mixing ratio of the two may be changed to adjust the characteristic of the organic thin film 8, and the above-described copolymer has a smaller anti-electric filed than a polymer of vinylidene fluoride and a more squared hysteresis loop.

Figure 2:
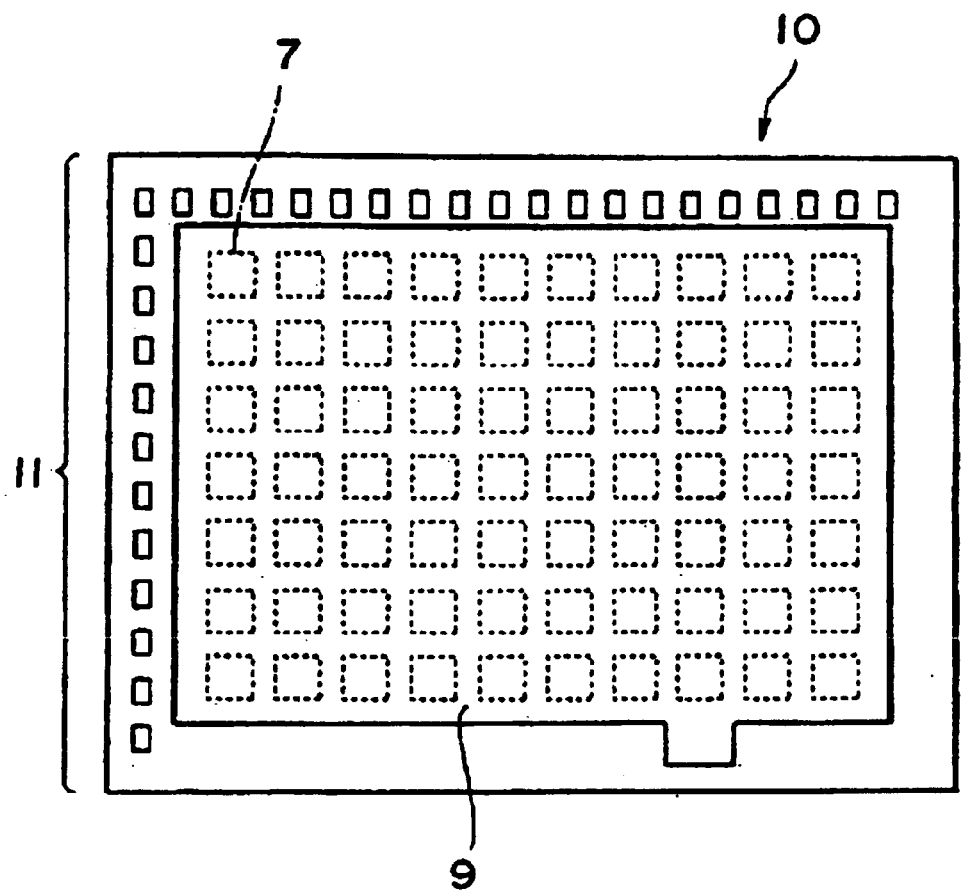
FIG. 2 shows a plan view of the non-volatile memory device in accordance with the first embodiment of the present invention.
Figure 3:
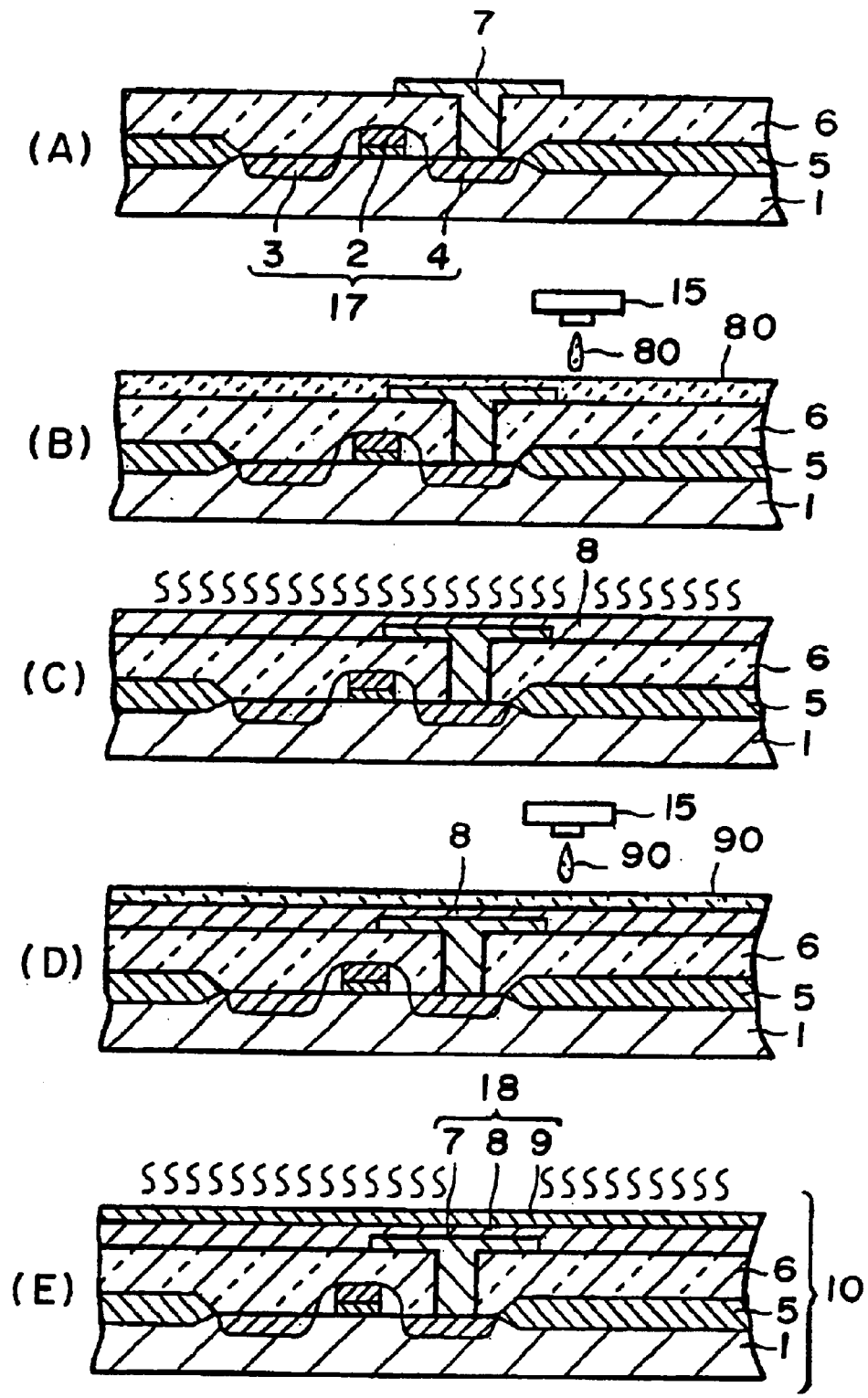
FIG. 3 shows cross-sectional views of the non-volatile memory device in a manufacturing process in accordance with the first embodiment of the present invention.

FIG. 2 shows a plan view of the non-volatile memory device described above. A memory cell array 10 has a plurality of the lower electrodes 7 disposed in an array form in a specified region (a memory cell assembly section), that are etched in a specified configuration. Also, an upper electrode 9 is formed in a manner to cover the plurality of the lower electrodes 7 across the entire surface of the memory cell assembly section. In this structure, the upper electrode 9 plays a role of an electrode (a common electrode) commonly shared by all of the memory cells.

Also, a variety of connection terminals 11 such as address terminals for peripheral circuits such as drivers to access respective memory cells, data input/output terminals and the like are provided in a peripheral section of the memory cell array 10.

Next, a process of manufacturing a non-volatile memory device is described with reference to FIG. 3. As shown in (A) of the same figure, by utilizing a known semiconductor process, a silicon oxide film is formed over a semiconductor substrate 1, impurity ions are implanted, and a polycrystal silicon film containing phosphorous is formed and patterned to thereby form a gate electrode 2, a source region 3, a drain region 4 and the like to form a cell transistor 17, an element isolation insulation film 5 and an interlayer insulation film 6. Furthermore, contact holes that communicate with the drain region 4 are opened in the interlayer insulation film 6, and an aluminum film is formed by a sputtering method over the interlayer insulation film 6 and thereafter patterned in an array configuration to form a plurality of lower electrodes 7 in a memory cell assembly section.

Then, organic materials having the above-described spontaneous polarization are dissolved in a specified solvent to make an organic thin film material solution 80, which is then coated over the entire surface of the memory cell assembly section over the lower electrodes 7 by using an ink jet type recording head 15 ((B) of the same figure). The organic thin film material solution 80 acts as a precursor material to obtain an organic thin film 8 in succeeding steps. A solvent to dissolve the organic materials includes PGMEA, cyclohexane, carbitol acetate and the like. Glycerin, diethylene glycol, ethylene glycol and the like may be added as a wetting agent or a binder as required. To eject the organic thin film material solution 80 through the ink jet type recording head 15, its viscosity may preferably be lower than several centipoise and its surface tension is in a range between 20 dyn/cm~70 dyn/cm.

Since an area to be coated with the organic thin film material solution 80, in other words, an area of the memory cell assembly section, is greater than an area occupied by each memory cell, patterning and coating thereof by an ink jet type recording head are possible. By the patterning process that is conducted with the ink jet type recording head, the organic thin film material precursor material 80 can be coated at any specified location and with any specified thickness on a pattern forming surface with a low cost facility. The ink jet type recording head can be of a piezo-jet type in which required fluid is ejected by changing the volume of a piezoelectric element, or of a bubble jet type in which required fluid is ejected by rapidly generating vapor by an application of heat. The organic thin film material solution 80 is coated on the respective lower electrodes 7 that are disposed in an array, and then is dried by a heat treatment at temperatures of 150° C.~200° C. As a result of this treatment, the solvent composition of the organic thin film material solution 80 evaporates and solidifies to become an organic thin film 8 ((C) of the same figure).

Then, fine particles of metal that composes an upper electrode, such as, for example, fine particles of aluminum are dissolved in an appropriate solvent to make an upper electrode material solution 90, which is coated over the organic thin film 8 using the ink jet type recording head 15 ((D) of the same figure). The upper electrode material solution 90 acts as a precursor material to form an upper electrode 9 in succeeding steps. A solvent to dissolve the aluminum particles includes butyl carbitol acetate, 3-dimethyl-2-imidazolyzen, BMA and the like. Then, the upper electrode material solution 90 coated over the organic thin film 8 is heat-treated to evaporate the solvent composition to thereby form the upper electrode 9 ((E) of the same figure).

It is noted that a metal that composes the upper electrode 9 includes, in addition to aluminum, $RuO_2$, Pt, $IrO_2$, $OsO_2$, $MoO_2$, $ReO_2$, $WO_2$, $YBa_2Cu_3O_7$—x, Au, Ag, In, In—Ga alloy, Ga, solder and the like.

The connecting terminals 11 of the memory cell array 10 obtained in the above-described manufacturing process are connected to peripheral circuits such as drivers, and further sealed by a resin to complete a non-volatile memory device.

In accordance with the manufacturing method described above, since the organic thin film 8 can be formed and patterned by the ink jet type recording head 15, the film forming temperature of the organic thin film 8 can be set at lower than 150° C.~200° C. Therefore, damage that may be inflicted on the cell transistor 17 can be substantially suppressed, compared to the conventional manufacturing method in which a ferroelectric capacitor 18 is formed by the Sol-Gel method that requires a heat treatment at temperatures above 650° C. As a result, since the patterning process for the organic thin film 8 by the ink jet type recording head 15 conforms with the semiconductor process for forming the cell transistor, the problems of the conventional technique described above can be solved.

Also, in the ferroelectric process using the conventional Sol-Gel method, a process for patterning a ferroelectric film 19 by a lithography method is required. However, in accordance with the present manufacturing method, the organic thin film 8 can be coated and patterned by the ink jet type recording head 15, and therefore, a lithography process can be omitted. As a result, the manufacturing process can be simplified.

Also, in the conventional lithography process, steps of coating, exposing and developing a resist are required, such that a large facility investment and a great maintenance cost are required. Furthermore, since the material once coated is removed in an etching step, there is a problem in that a large amount of the material is wasted. However, in accordance with the present manufacturing method, since the film formation and patterning of the organic thin film 8 can be simultaneously conducted by the ink jet type recording head 15, a large-scale facility such as a factory may not be required, and the manufacturing cost can be substantially lowered because the waste of the material does not occur.

Also, since the resolution of the ink jet type recording head 15 is very fine, for example, at 400 dpi, any desired patterning and coating can be conducted with a precision on the order of $\mu$m. Therefore, minute patterning of the organic thin film 8 is possible, which accommodates a higher integration of memory devices.

It is noted that, in accordance with the certain embodiments of the present invention, in addition to the ink jet type recording head 15 that is used as a means to coat the organic thin film material solution 80, a variety of printing methods, a spin-coating method, a spray-coating method and the like can also be used.

Also, when compared with the conventional technique in which a PZT based material is used for the ferroelectric film 19, the organic thin film 8 does not contain zinc, and therefore, pollution of the manufacturing process line by diffusion of zinc can be prevented.

Hereunder, a second device embodiment of the present invention will be described with reference to FIGS. 4 through 7.

Figure 4:
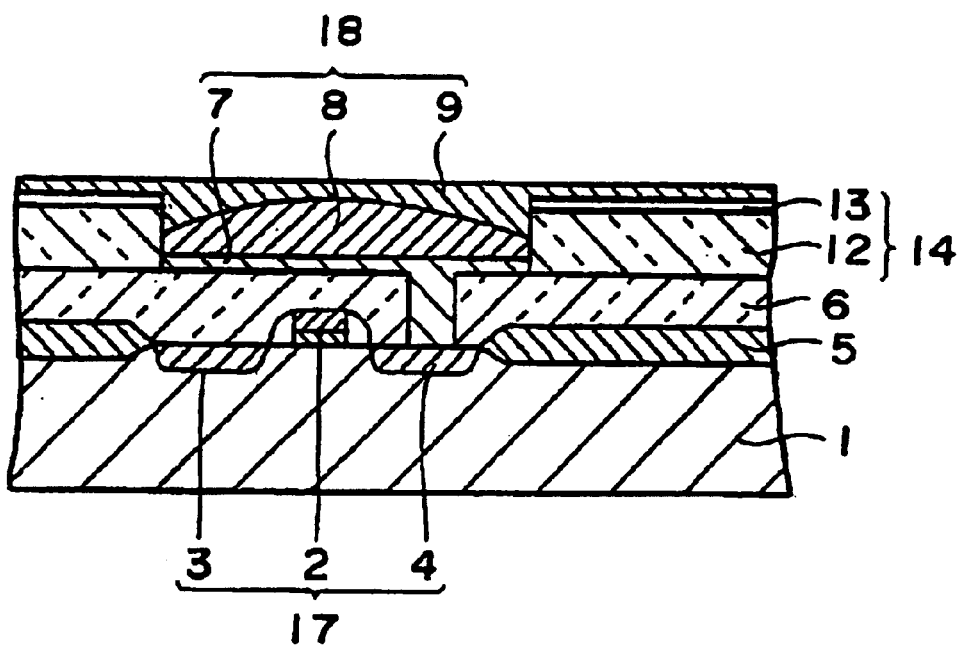
FIG. 4 shows a cross-sectional view of a non-volatile memory device in accordance with a second embodiment of the present invention.

FIG. 4 shows a cell cross-sectional structure of a non-volatile memory device in accordance with the present embodiment. The non-volatile memory device shown in the figure has a structure basically similar to that of the first device embodiment. Accordingly, the same elements are denoted by the same reference numbers, and their detailed description is omitted.

The non-volatile memory device of the present embodiment is different from the first embodiment in that partitioning members 14 are formed to mutually partition ferroelectric capacitors 18 formed in respective memory cells one from the other. The partitioning members 14 are provided to prevent cross talk between the memory cells, which may occur with a higher integration of memory devices.

The partitioning member 14 has a two-layer structure having an interlayer insulation film 12 and a repelling liquid layer 13 disposed thereon. The repelling liquid layer 13 is a thin film that has a property of a large contact angle with respect to the organic thin film material solution 80, and has a non-affinity for the organic thin film material solution 80. Since an upper layer of the partitioning member 14 is formed with a material that has a non-affinity for the organic thin film material solution 80, when the organic thin film material solution 80 is filled in a recessed portion defined by the partitioning members, it is prevented from leaking from the recessed portion to adjacent recessed portions. The repelling liquid layer 13 may preferably be formed from a material, such as, for example, polyimide, amorphous silicon, polysilicon, and an organic compound including fluorine.

Also, when a silicon oxide film or a silicon nitride film is used as the interlayer insulation film 12, because these materials have an affinity for the organic thin film material solution 80, the organic thin film material solution 80 can be filled well in a recessed portion defined by the partitioning members 14. Also, when the lower electrode 7 is formed from aluminum, since the organic thin film material solution 80 has an affinity for the lower electrode 7, it can fill the recessed portions much better.

Figure 5:
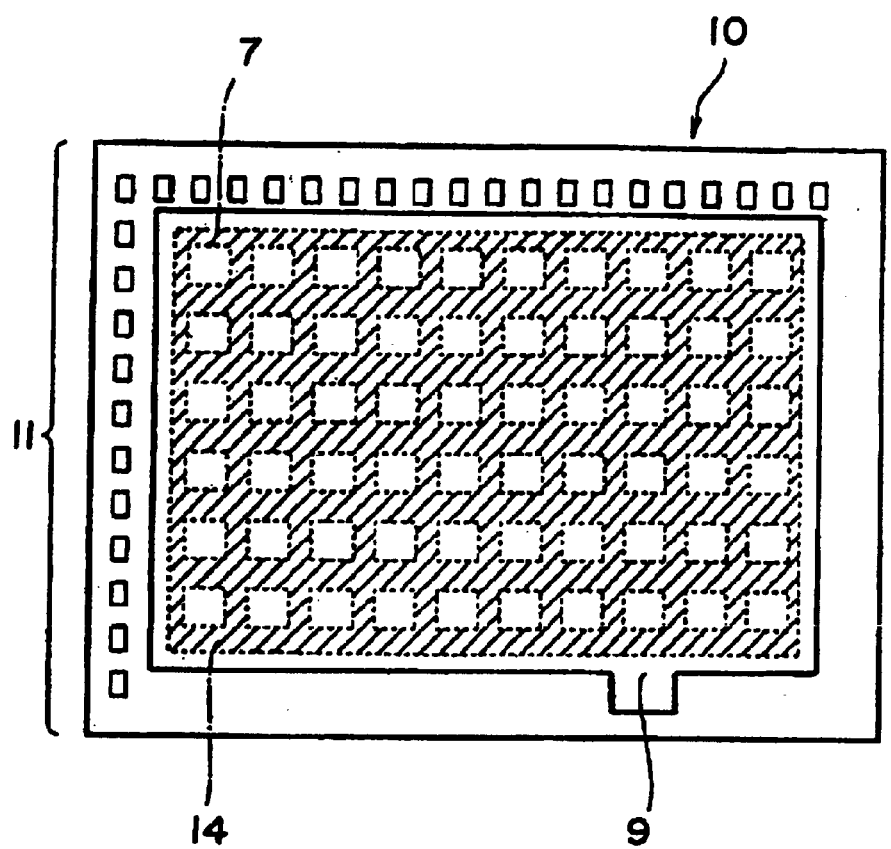
FIG. 5 shows a plan view of the non-volatile memory device in accordance with the second embodiment of the present invention.

FIG. 5 shows a plan view of the above-described non-volatile memory device. The plurality of lower electrodes 7 that are partitioned in an array configuration by the partitioning members 14 are disposed in a specified region (a memory assembly section) of the memory cell array 10. An upper electrode 9 is formed in a manner to cover the lower electrodes 7 across the entire surface of the memory cell assembly section. In this structure, the upper electrode 9 plays a role of an electrode (common electrode) commonly shared by all of the memory cells. Also, a variety of connection terminals 11 such as address terminals for peripheral circuits including drivers and the like to access the respective memory cells, data input/output terminals and the like are formed in a peripheral section of the memory cell array 10.

Figure 6:
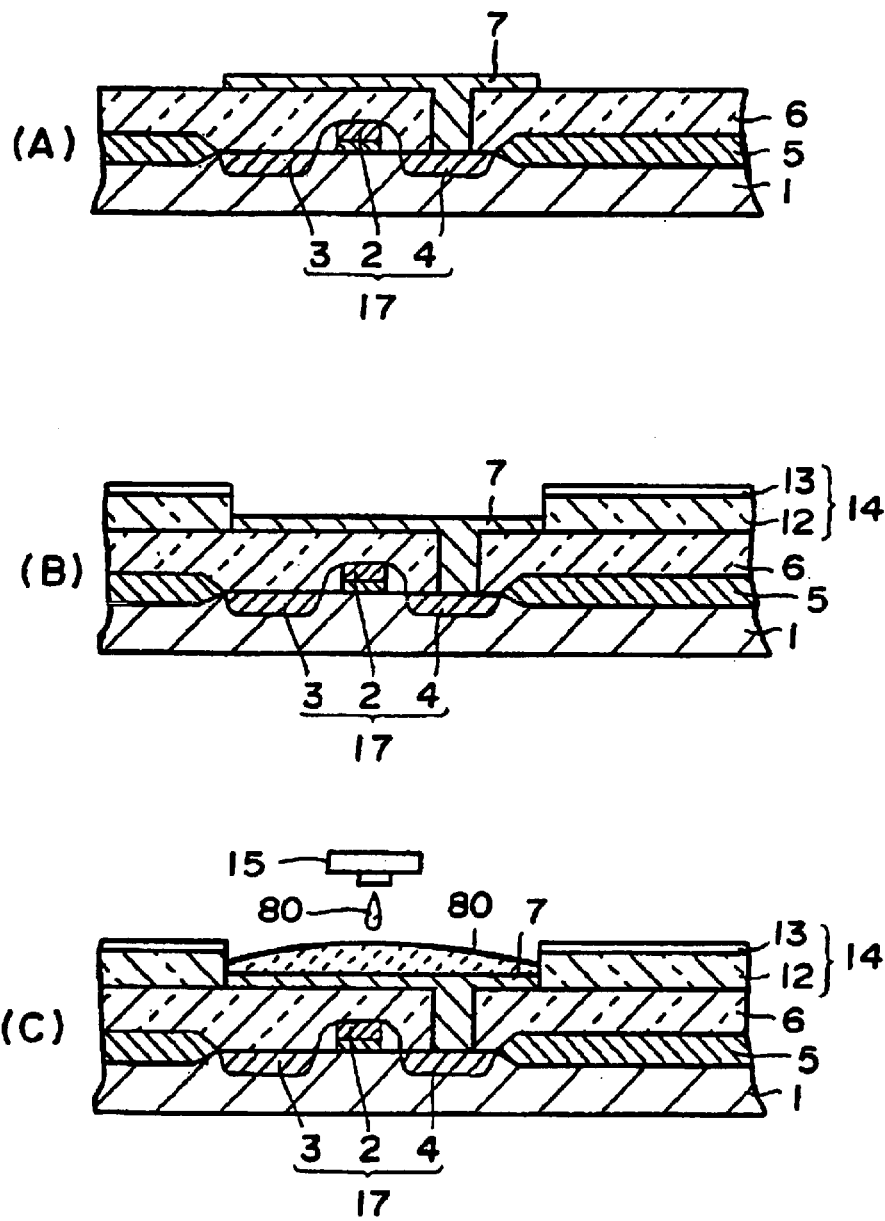
FIG. 6 shows cross-sectional views of the non-volatile memory device in a manufacturing process in accordance with the second embodiment of the present invention.
Figure 7:
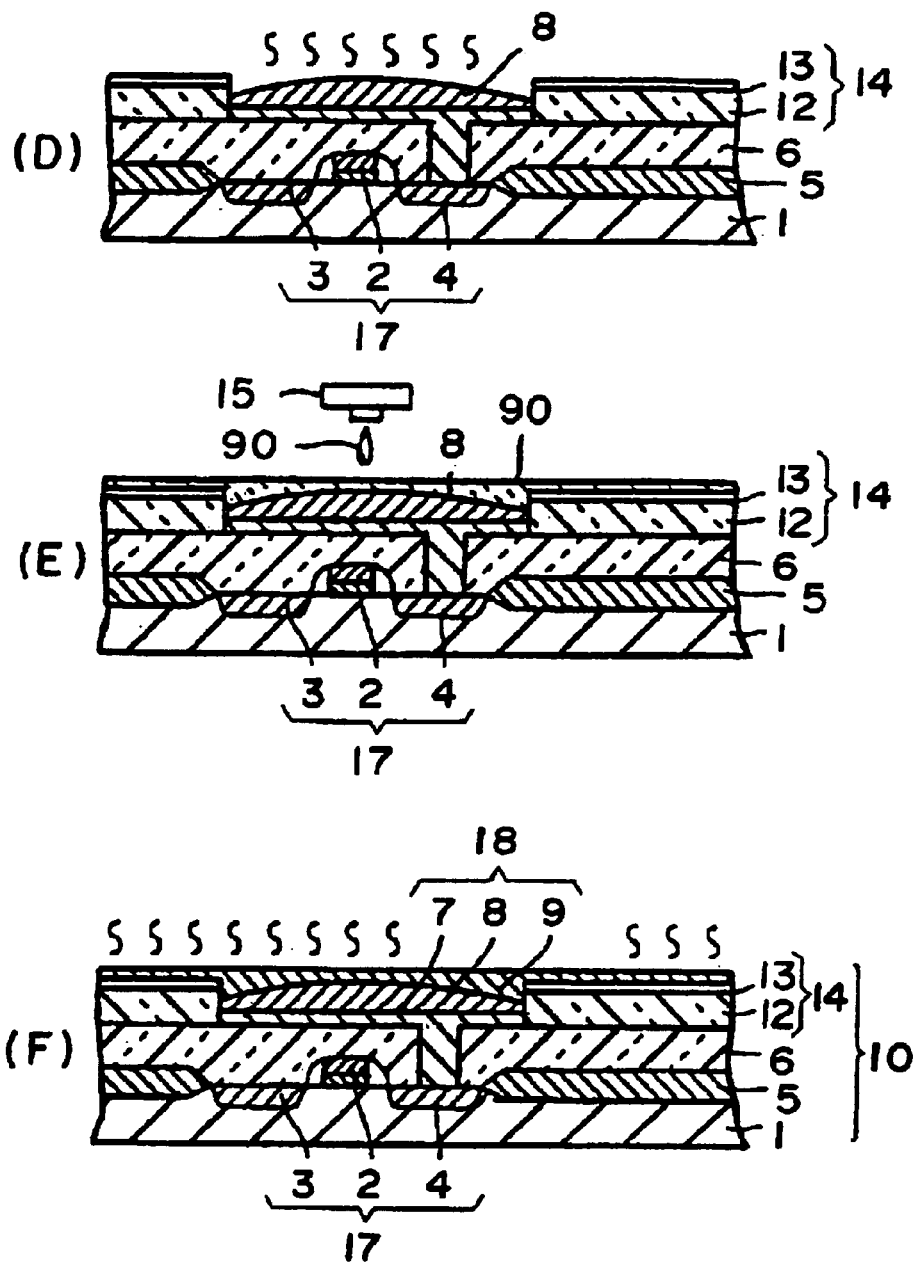
FIG. 7 shows cross-sectional views of the non-volatile memory device in a manufacturing process in accordance with the second embodiment of the present invention.
Figure 8:
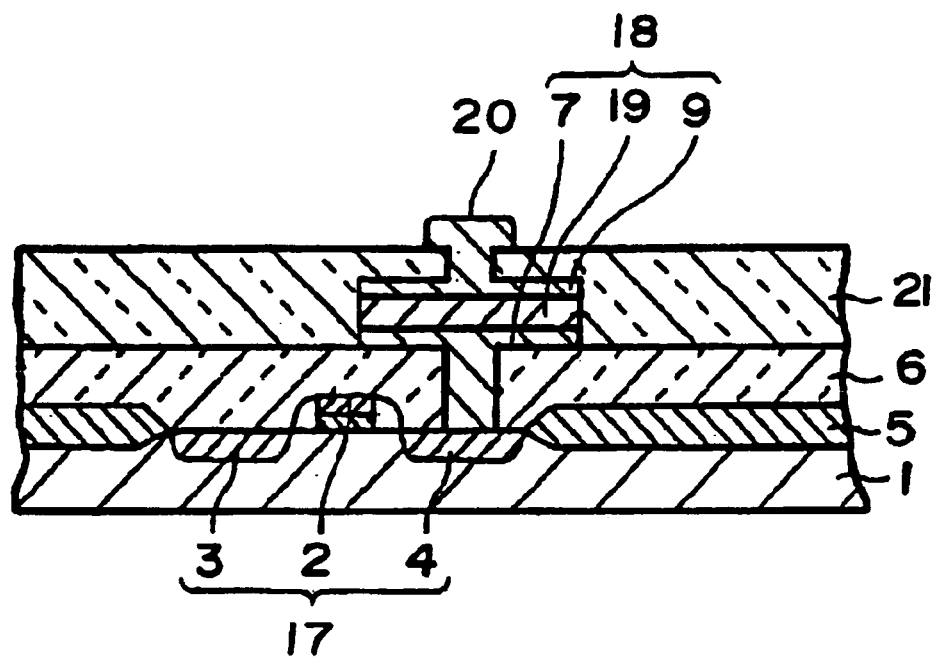
FIG. 8 shows a cross-sectional view of a conventional non-volatile memory device.

Next, another process of manufacturing a non-volatile memory device is described with reference to FIG. 6 and FIG. 7. As shown in FIG. 6(A), by utilizing a known semiconductor process, a gate electrode 2, a source region 3, a drain region 4 and the like are formed over a semiconductor substrate 1 to form a cell transistor 17, and an element isolation insulation film 5 and an interlayer insulation film 6 are formed. Furthermore, contact holes that communicate with the drain region 4 are opened in the interlayer insulation film 6, and an aluminum film is formed by a sputtering method over the interlayer insulation film 6 and thereafter is patterned in an array configuration to form lower electrodes 7.

Then, an interlayer insulation film 12 and a repelling liquid layer 13 are successively deposited over the interlayer insulation film 6 including the lower electrodes 7, and portions corresponding to the lower electrodes 7 are selectively etched to expose surfaces of the lower electrodes 7 ((B) of the same figure). By this process, partitioning members 14 are formed in a memory cell assembly section. For example, when a silicon oxide film is formed as the interlayer insulation film 12, such a film can be formed by a plasma CVD method using an organic silane (TEOS) and oxygen as reactive gases, and when a silicon nitride film is formed, such a film can be formed by a plasma CVD method using a silane based gas and nitrogen as reactive gases.

When polyimide is formed in a film for the repelling liquid layer 13, an appropriate method such as a lithography method, a printing method or the like can be selected. When a lithography method is used, an organic material may be coated by an appropriate method such as a spin coating, spray coating, roll coating, dye coating, dip coating or the like.

Subsequently, an organic thin film material solution 80 is filled over the lower electrodes 7 that are partitioned by the partitioning members 14 ((C) of the same figure), and heat-treated to evaporate a solvent composition thereof to form an organic thin film 8 (FIG. 7 (D)). The organic thin film material solution 80 is filled by coating each of the memory cells in an amount that does not flow over the partition members 14. Then, an upper electrode material solution 90 is coated over each of the memory cells ((E) of the same figure), and heat-treated to evaporate a solvent composition thereof to form an upper electrode 9 ((F) of the same figure). By conducting the steps described above, a memory cell array 10 is formed.

In accordance with the manufacturing method described above, the partition members 14 are provided to partition the memory cells, such that cross talk between the adjacent memory cells, which may occur with a higher memory device integration, can be effectively inhibited or prevented. Therefore, higher memory device integration becomes possible. Also, since the repelling liquid layer 13 is formed in an upper layer of the partitioning member 14, the organic thin film material solution 80 can be readily filled over the lower electrodes 7 that are partitioned by the partitioning members 14.

In accordance with certain embodiments of the present invention, the film forming temperature for an organic thin film having a spontaneous polarization can be set below 150° C.~200° C. Therefore, damage that may be inflicted on the cell transistor can be substantially suppressed, compared to the conventional manufacturing method in which a ferroelectric capacitor is formed by the Sol-Gel method that requires a heat treatment at temperatures above 650° C. As a result, the ferroelectric process of the present invention conforms to a semiconductor process for forming cell transistors.

Also, by the ferroelectric process using an ink jet type recording head, a lithography step can be omitted, with the result that the manufacturing process is simplified and the manufacturing cost is lowered.

Furthermore, since certain embodiments of the present invention provides a structure in which partition members are provided to partition memory cells, cross talks between the adjacent memory cells, which accompany with a higher memory device integration, can be effectively prevented. Therefore, higher memory device integration becomes possible.

The present invention is not limited to the embodiments described above, and modifications can be made within the scope of the subject matter of the invention.

What is claimed:

1. A non-volatile memory device comprising:
    a ferroelectric capacitor that is formed from an organic thin film capable of a polarization inversion by an external electric field and provided between a first electrode and a second electrode, and
    partitioning members formed to mutually partition the organic thin film, wherein the partitioning members are formed to include a first insulation layer and a second layer that repels an organic thin film solution used to form the organic thin film.

2. A non-volatile memory device as set forth in claim 1, the device including a memory cell comprising a transistor and the ferroelectric capacitor.

3. A non-volatile memory device as set forth in claim 1, wherein the organic thin film solution has an affinity for the first insulation layer.

4. A non-volatile memory device as set forth in claim 1, wherein the organic thin film solution has an affinity for the first electrode.

5. A non-volatile memory device as set forth in claim 1, wherein the second electrode is formed to cover the organic thin film that is partitioned by the portioning members.

6. A non-volatile memory device as set forth in claim 5, wherein the device includes a memory cell assembly section in which the organic thin film is positioned on the first electrode, and the second electrode covers the organic thin film across the entire surface of the memory cell assembly section.

7. A semiconductor device comprising the non-volatile memory device set forth in claim 1.

8. A non-volatile memory device as in claim 1, wherein the organic thin film includes a curved surface, wherein a central portion of the thin film on the first electrode has a greater thickness than side portions of the thin film on the first electrode, and the second electrode is in contact with the curved surface.

9. A non-volatile memory device as in claim 1, wherein the non-volatile memory device includes a transistor, the transistor including a drain region, and the first electrode is in electrical contact with the drain region.

10. A semiconductor device including a ferroelectric capacitor that is provided between a lower electrode and an upper electrode, the semiconductor device comprising:
    a semiconductor substrate including a transistor,
    an insulation layer on the transistor,
    a lower electrode on the insulation layer, wherein the lower electrode is in electrical contact with a part of the transistor,
    partitioning members on the insulation layer, the partitioning members adapted to separate the lower electrode from other lower electrodes, the partitioning members including a multilayer structure including a lower layer and an upper layer that is different than the lower layer, the upper layer including an upper surface; and
    a solid organic layer on the lower electrode that is partitioned from other lower electrodes by the partitioning members, wherein the solid organic layer is not positioned on the upper surface of the upper layer of the partitioning members.

11. A semiconductor device as set forth in claim 10, wherein the upper layer of the partitioning members comprises a material selected from the group consisting of polyimide, amorphous silicon, polysilicon, and an organic compound including fluorine.

12. A semiconductor device as set forth in claim 11, wherein the organic thin film comprises a copolymer of vinylidene fluoride and trifluoroethylene.

13. A semiconductor device as set forth in claim 11, wherein the lower layer of the partitioning members comprises a material selected from the group consisting of silicon oxide and silicon nitride.

14. A semiconductor device as in claim 10, wherein the transistor includes a drain region, and the lower electrode is in electrical contact with the drain region.

15. A semiconductor device including a ferroelectric capacitor that is provided between a lower electrode and an upper electrode, the semiconductor device comprising:
    a semiconductor substrate including a transistor,
    an insulation layer on the transistor,
    a lower electrode on the insulation layer, wherein the lower electrode is in electrical contact with a part of the transistor,
    partitioning members on the insulation layer, the partitioning members adapted to separate the lower electrode from other lower electrodes, the partitioning members including an upper surface; and
    a solid organic layer on the lower electrode that is partitioned from other lower electrodes by the partitioning members, wherein the solid organic layer is not positioned on the upper surface of the partitioning members;
    wherein the partitioning members include an upper layer comprising a material having a non-affinity for a solution used to form the solid organic layer.

16. A semiconductor device as set forth in claim 15, wherein the partitioning members include a lower layer comprising a material having an affinity for a solution used to form the solid organic layer.

17. A semiconductor device, comprising:
    a plurality of cells each including a transistor therein, the cells also each including a first capacitor electrode therein, the first capacitor electrodes being positioned on an insulating layer, the first capacitor electrodes in adjacent cells being separated from each other,
    partitioning members on the insulation layer, wherein the partitioning members are positioned to separate the cells from one another, the partitioning members including first and second layers, the second layer including an upper surface;
    an organic layer on the first capacitor electrodes between the partitioning members, wherein the organic layer is not positioned in contact with the upper surface, and
    a continuous second capacitor electrode on the organic layer, the second capacitor electrode layer formed to be a common electrode for the cells.

18. A semiconductor device as in claim 17, wherein the organic layer is capable of a polarization inversion by exposure to an electric field.

19. A semiconductor device comprising:
    an organic thin film positioned on a first electrode plurality of cells each including a transistor therein, the cells also each including a first capacitor electrode therein, the first capacitor electrodes being positioned on an insulating layer, the first capacitor electrodes in adjacent cells being separated from each other,
    partitioning members on the insulation layer, wherein the partitioning members are positioned to separate the cells from one another, layer the partitioning members including an upper surface;
    an organic layer on the first capacitor electrodes between the partitioning members, wherein the organic layer is not positioned in contact with the upper surface of the partitioning members, and
    a continuous second capacitor electrode on the organic layer, the second capacitor electrode layer formed to be a common electrode for the cells;
    wherein the partitioning members include first and second layers, the first layer being formed from a material having an affinity for an organic solution used to form the organic layer, the second layer being formed from a material having a non-affinity for the organic solution used to form the organic layer.

20. A semiconductor device as in claim 19, wherein the first layer is formed from a material selected from the group consisting of silicon oxide and silicon nitride, and the second layer is formed from a material selected from the group consisting of polyimide, amorphous silicon, polysilicon, and an organic compound including fluorine.

21. A semiconductor device comprising:
    a plurality of ferroelectric capacitors each including an organic thin film capable of a polarization inversion by an external electric field, a first electrode, and a second electrode, wherein the organic thin film is positioned over the first electrode and under the second electrode;
    partitioning members separating each of the first electrodes and each of the organic thin films of the ferroelectric capacitors, the partitioning members including an upper surface;
    wherein the partitioning members do not extend over any portion of the organic thin film, and wherein no portion of the organic thin film extends over any portion of the upper surface of the partitioning members.

22. A semiconductor device as in claim 21, wherein the partitioning members include a first layer and a second layer, wherein the first layer is formed from a material having an affinity for an organic liquid used to form the organic film, and the second layer is formed from a material having a non-affinity for an organic liquid used to form the organic thin film.

23. A semiconductor device as in claim 21, further comprising a transistor positioned between isolation regions, wherein at least a portion of the ferroelectric capacitor is positioned over the transistor and the first electrode is electrically coupled to a part of the transistor, and at least a portion of the partitioning members are positioned over the isolation regions.

* * * * *